(12) United States Patent
Park (10) Patent No.: US 11,455,067 B2
(45) Date of Patent: Sep. 27, 2022

(54) TOUCH DISPLAY DEVICE (71) Applicant: LG Display Co., Ltd., Seoul (KR)

(72) Inventor: Sung-Jin Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/006,458

(22) Filed: Aug. 28, 2020

(65) Prior Publication Data
US 2021/0200386 A1  Jul. 1, 2021

(30) Foreign Application Priority Data

Dec. 31, 2019  (KR) ........................ 10-2019-0179486

(51) Int. Cl.
*G06F 3/044* (2006.01)
*G06F 3/041* (2006.01)
*H01L 27/32* (2006.01)
*H01L 51/52* (2006.01)

(52) U.S. Cl.
CPC .......... *G06F 3/0448* (2019.05); *G06F 3/0412* (2013.01); *G06F 3/0446* (2019.05); *H01L 27/323* (2013.01); *H01L 27/3216* (2013.01); *H01L 27/3246* (2013.01); *H01L 51/5253* (2013.01); *G06F 3/0443* (2019.05); *G06F 3/0445* (2019.05); *G06F 2203/04102* (2013.01); *G06F 2203/04112* (2013.01)

(58) Field of Classification Search
CPC . G06F 2203/04102; G06F 2203/04112; G06F 3/0412; G06F 3/0443; G06F 3/0445; G06F 3/0446; G06F 3/0448; H01L 27/3216; H01L 27/323; H01L 27/3246; H01L 51/5253

USPC .................................................. 345/170–178
See application file for complete search history.

(56) References Cited

U.S. PATENT DOCUMENTS

| | | | | |
|---|---|---|---|---|
| 9,837,476 B2 * | 12/2017 | Park | ..................... | H01L 27/3216 |
| 10,566,395 B2 * | 2/2020 | Lee | ........................ | G06F 3/0443 |
| 10,818,738 B2 * | 10/2020 | Lee | ..................... | H01L 51/5253 |
| 10,955,981 B2 * | 3/2021 | Gong | ..................... | G06F 3/0443 |
| 11,158,837 B2 * | 10/2021 | Kim | ..................... | H01L 51/5253 |

(Continued)

FOREIGN PATENT DOCUMENTS

| CN | 109508106 A | * | 3/2019 | ........... G06F 3/0448 |
|---|---|---|---|---|
| CN | 109508106 B | * | 8/2020 | ........... G06F 3/0448 |

(Continued)

*Primary Examiner* — Prabodh M Dharia
(74) *Attorney, Agent, or Firm* — Birch, Stewart, Kolasch & Birch, LLP (57) ABSTRACT

Discussed is a touch display device for preventing deterioration in touch performance. The touch display device includes touch electrodes formed so that surfaces thereof that face the vertices of an emission area of a light-emitting element are formed in a rounded shape, thereby making the spacing distances between the touch electrodes and the emission area constant regardless of the positions thereof. The touch display device includes a light-emitting element disposed in an emission area having a plurality of vertices, an encapsulation unit disposed on the light-emitting element, and touch electrodes disposed on the encapsulation unit so as to surround the emission area. Accordingly, it is possible to eliminate the difference between viewpoints at which color shift occurs depending on the viewing direction.

23 Claims, 9 Drawing Sheets

(56) References Cited

U.S. PATENT DOCUMENTS

| | | | |
|---|---|---|---|
| 2015/0356902 A1* | 12/2015 | Seo | G09G 3/3208 |
| | | | 345/589 |
| 2016/0218159 A1* | 7/2016 | Park | H01L 27/3246 |
| 2018/0095570 A1* | 4/2018 | Hong | H01L 27/323 |
| 2018/0240850 A1* | 8/2018 | Chen | G06F 3/0443 |
| 2018/0330671 A1* | 11/2018 | Kim | G09G 3/3266 |
| 2018/0348913 A1* | 12/2018 | Lee | G06F 3/0412 |
| 2018/0358413 A1* | 12/2018 | Lee | H01L 27/3276 |
| 2019/0204952 A1* | 7/2019 | Han | G06F 3/0443 |
| 2020/0028120 A1* | 1/2020 | Sugitani | H01L 51/5275 |
| 2020/0104014 A1* | 4/2020 | Gong | G06F 3/0448 |
| 2020/0135813 A1* | 4/2020 | Lee | G06F 3/044 |
| 2020/0160761 A1* | 5/2020 | Ahn | H01L 51/5281 |
| 2020/0368616 A1* | 11/2020 | Delamont | A63F 13/25 |
| 2021/0005678 A1* | 1/2021 | Lee | H01L 51/5253 |
| 2021/0005845 A1* | 1/2021 | Kim | H01L 51/5281 |
| 2021/0028395 A1* | 1/2021 | Kim | H01L 27/323 |
| 2021/0043713 A1* | 2/2021 | Sun | H01L 27/3258 |
| 2021/0200386 A1* | 7/2021 | Park | H01L 27/3246 |

FOREIGN PATENT DOCUMENTS

| | | | | |
|---|---|---|---|---|
| KR | 10-2018-0069341 A | 6/2018 | | |
| KR | 10-2019-0101517 A | 9/2019 | | |
| KR | 10-2019-0104285 A | 9/2019 | | |
| WO | WO-2019052125 A1 * | 3/2019 | | G06F 3/0446 |

* cited by examiner

TOUCH DISPLAY DEVICE

CROSS-REFERENCE TO RELATED APPLICATIONS

This application claims the priority benefit of Korean Patent Application No. 10-2019-0179486, filed on Dec. 31, 2019 in the Republic of Korea, the entire contents of which are hereby expressly incorporated by reference as if fully set forth herein into the present application.

BACKGROUND OF THE INVENTION

Field of the Invention

The embodiments of the present invention relate to a touch display device, and more particularly to a touch display device for preventing deterioration in touch performance.

Discussion of the Related Art

A touch sensor is an input device through which a user can input a command by selecting instructions displayed on a screen of a display device using a hand or an object. The touch sensor converts a contact position that directly contacts a human hand or an object into an electrical signal and receives selected instructions based on the contact position as an input signal. Such a touch sensor can substitute for a separate input device that is connected to a display device and operated, such as a keyboard or a mouse, and thus the range of application of the touch sensor is continually increasing.

However, a portion of light generated in a display panel may not be radiated to the outside due to the presence of touch electrodes constituting a touch sensor. In order to minimize this phenomenon, touch electrodes may be formed to have a reduced line width. However, this may deteriorate touch performance.

SUMMARY OF THE INVENTION

Accordingly, the present invention is directed to a touch display device that substantially obviates one or more problems due to limitations and disadvantages of the related art.

An object of the present invention is to provide a touch display device for preventing deterioration in touch performance.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, a touch display device includes a plurality of touch electrodes, which are formed so that the surfaces thereof facing the vertices of an emission area of a light-emitting element are formed in a rounded shape, thereby making the spacing distances between the touch electrodes and the emission area constant regardless of the positions thereof.

According to one aspect of the present invention, a touch display device includes a light-emitting element disposed in an emission area having a plurality of vertices; an encapsulation unit disposed on the light-emitting element; and a plurality of touch electrodes disposed on the encapsulation unit so as to surround the emission area, the plurality of touch electrodes being formed so that surfaces thereof facing the vertices of the emission area of the light-emitting element are formed in a rounded shape.

According to another aspect of the present invention, a touch display device includes a light-emitting element disposed in each of a plurality of emission areas; an encapsulation unit disposed on the light-emitting element; and a plurality of touch electrodes disposed on the encapsulation unit so as to surround the plurality of emission areas, wherein corner regions of each of the plurality of emission areas and opposing regions of each of the plurality of touch electrodes that face the corner regions have different shapes from each other.

According to still another aspect of the present invention, a touch display device includes a light-emitting element disposed in each of a plurality of subpixels comprising emission areas having different sizes from each other; an encapsulation unit disposed on the light-emitting element; and a plurality of touch electrodes disposed on the encapsulation unit, wherein spacing distances between the emission areas and the plurality of touch electrodes are constant.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Reference will now be made in detail to exemplary embodiments of the present invention, examples of which are illustrated in the accompanying drawings.

Figure 1:
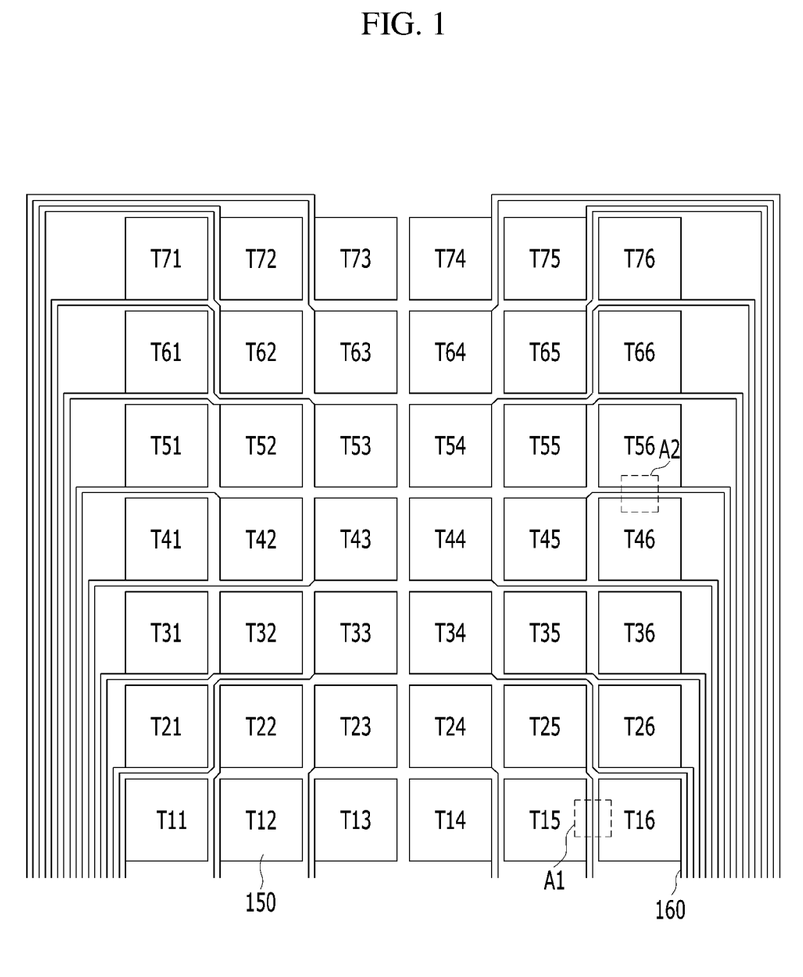
FIG. 1 is a plan view showing a touch display device according to an embodiment of the present invention.
Figure 2:
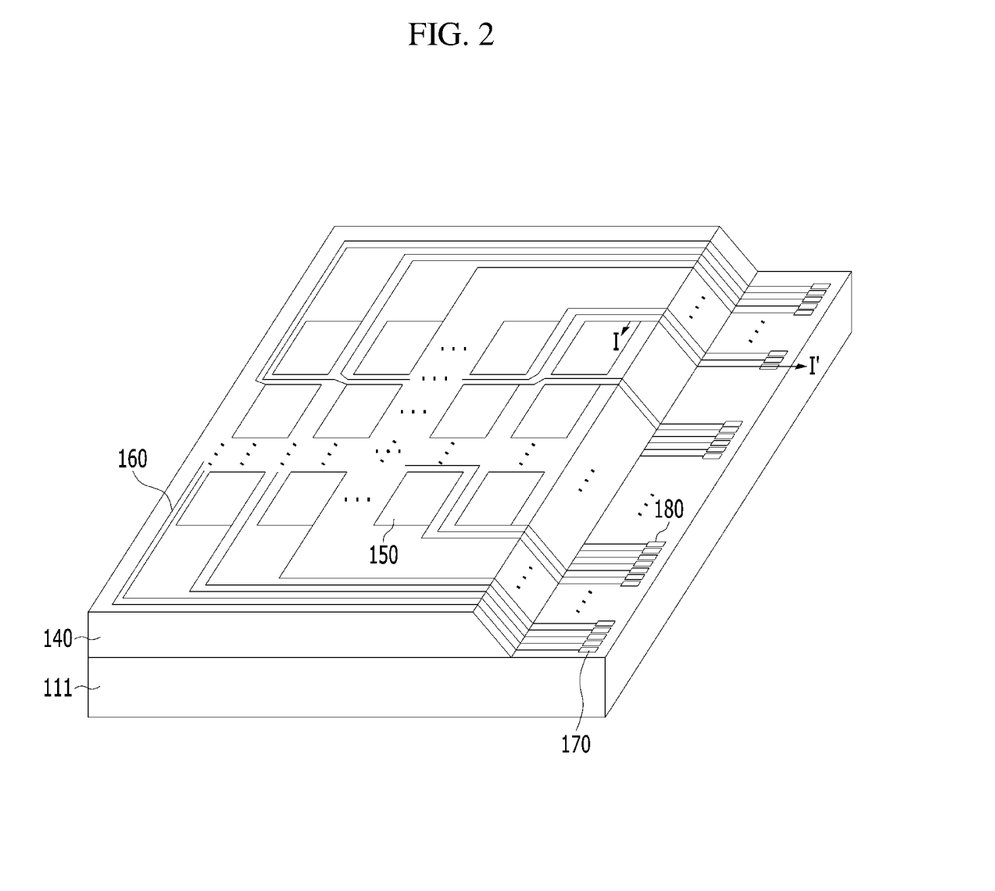
FIG. 2 is a perspective view showing the touch display device according to an embodiment of the present invention.
Figure 3:
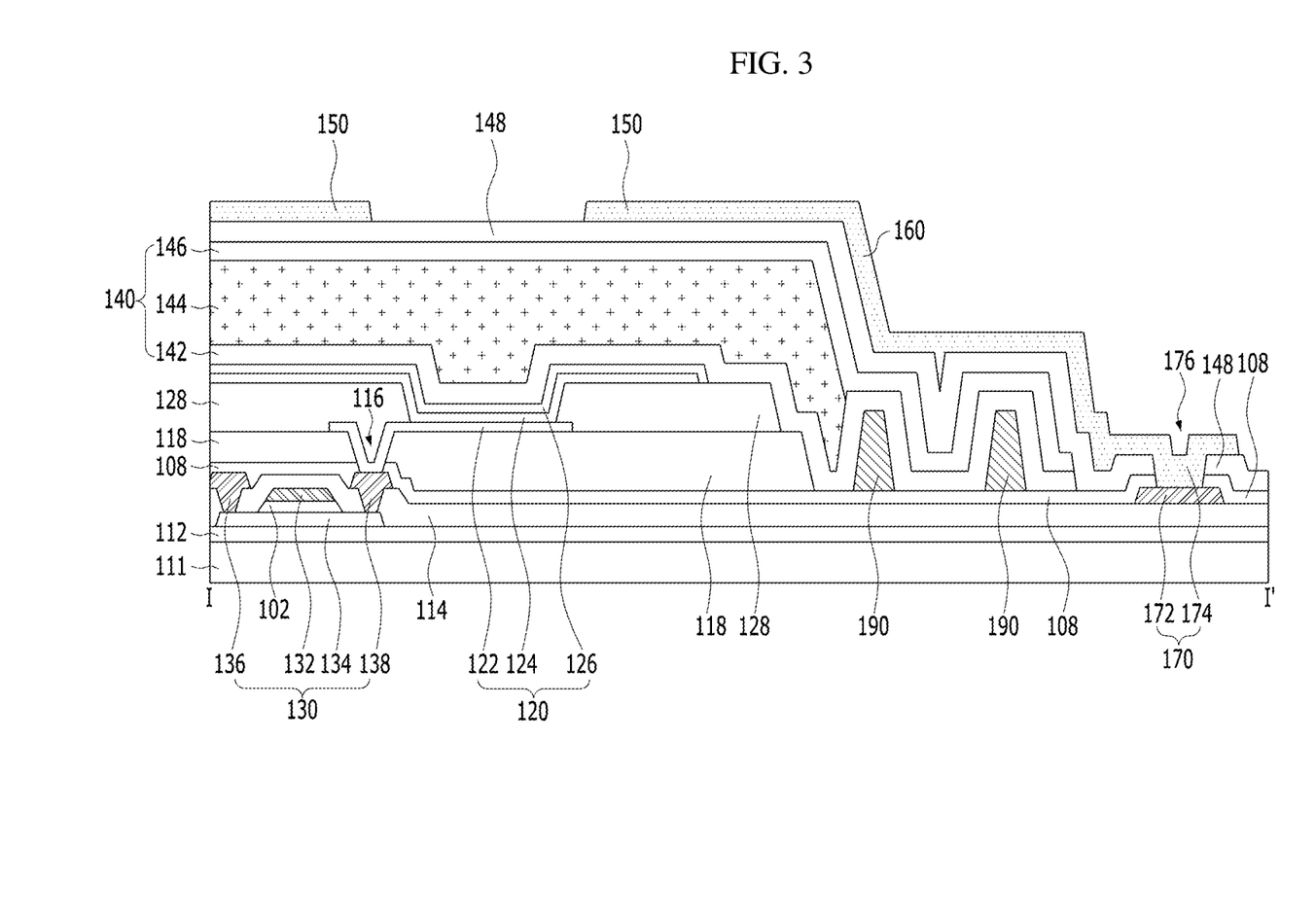
FIG. 3 is a cross-sectional view of the touch display device taken along line I-I' in FIG. 2.

FIG. 1 is a plan view showing a touch display device according to an embodiment of the present invention. FIG. 2 is a perspective view showing the touch display device according to an embodiment of the present invention. FIG. 3 is a cross-sectional view of the touch display device taken along line I-I' in FIG. 2. All the components of the touch display device according to all embodiments of the present invention are operatively coupled and configured.

The touch display device shown in FIG. 1 includes a plurality of touch electrodes 150 (e.g., T11 to T76) and a plurality of touch lines 160 connected to the respective touch electrodes 150.

Each of the touch electrodes 150 includes a capacitance formed therein, and thus is used as a self-capacitance-type touch sensor that senses variation in capacitance due to a user touch. In a self-capacitance sensing method using such touch electrodes 150, when a driving signal supplied through the touch line 160 is applied to the touch electrode 150, an electric charge Q accumulates in the touch sensor. At this time, when a user's finger or a conductive object touches the touch electrode 150, parasitic capacitance is additionally connected to the self-capacitance sensor, and thus the capacitance value varies. Therefore, it is possible to determine the presence or absence of a touch based on the difference in capacitance values between a touch sensor that is touched by a finger and a touch sensor that is not touched by a finger.

The touch electrodes 150, as shown in FIG. 2, are divided from each other in first and second directions intersecting each other, and are independently formed on an encapsulation unit 140. Each of the touch electrodes 150 is formed in a region corresponding to a plurality of subpixels in consideration of the size of an area touched by a user. For example, one touch electrode 150 is formed in a region that is from several times to several hundred times larger than the size of one subpixel. The plurality of subpixels comprising emission areas having different sizes from each other.

The touch electrodes 150 are formed so as to be the same size as each other. Accordingly, variation in touch sensitivity between the touch electrodes 150 is minimized, thus reducing noise.

The touch electrodes 150 are connected to the touch lines 160, and thus are connected to a touch-driving circuit.

The touch electrodes 150 and the touch lines 160 according to one or more embodiments of the present invention are directly formed on a display panel that generates an image. Specifically, as shown in FIGS. 2 and 3, the touch display device according to the embodiments of the present invention includes light-emitting elements 120 arranged in a matrix form on a substrate 111, an encapsulation unit 140 disposed on the light-emitting elements 120, and touch electrodes 150 disposed on the encapsulation unit 140.

The substrate 111 is formed of a flexible material such as plastic or glass so as to be foldable or bendable. For example, the substrate 111 is formed of polyimide (PI), polyethylene terephthalate (PET), polyethylene naphthalate (PEN), polycarbonate (PC), polyethersulfone (PES), polyacrylate (PAR), polysulfone (PSF), or cyclic-olefin copolymer (COC).

A plurality of thin-film transistors 130, included in the pixel-driving circuit, is disposed on the substrate 111. Each of the thin-film transistors 130 includes a semiconductor layer 134 disposed on a multi-buffer film 112, a gate electrode 132 overlapping the semiconductor layer 134 with a gate insulating film 102 interposed therebetween, and source and drain electrodes 136 and 138 formed on an interlayer insulating film 114 so as to be in contact with the semiconductor layer 134. Here, the semiconductor layer 134 is formed of at least one of an amorphous semiconductor material, a polycrystalline semiconductor material, and an oxide semiconductor material.

The light-emitting element 120 includes an anode 122, at least one light-emitting stack 124 formed on the anode 122, and a cathode 126 formed on the light-emitting stack 124.

The anode 122 is electrically connected to the drain electrode 138 of the thin-film transistor 130, which is exposed through a pixel contact hole 116 penetrating a protective film 108 and a pixel planarization layer 118.

At least one light-emitting stack 124 is formed on the anode 122 in an emission area that is defined by a bank 128. The at least one light-emitting stack 124 is formed by stacking a hole-related layer, an organic emission layer, and an electron-related layer on the anode 122 in that order or in the reverse order. In addition, the light-emitting stack 124 can include first and second light-emitting stacks, which face each other with a charge generation layer interposed therebetween. In this case, the organic emission layer of any one of the first and second light-emitting stacks generates blue light, and the organic emission layer of the other one of the first and second light-emitting stacks generates yellow-green light, whereby white light is generated through the first and second light-emitting stacks. Since the white light generated in the light-emitting stack 124 is incident on a color filter located above or below the light-emitting stack 124, a color image can be realized. Alternatively, colored light corresponding to each subpixel can be generated in each light-emitting stack 124 without a separate color filter in order to realize a color image. For example, the light-emitting stack 124 of the red subpixel can generate red light, the light-emitting stack 124 of the green subpixel can generate green light, and the light-emitting stack 124 of the blue subpixel can generate blue light.

The cathode 126 is formed so as to face the anode 122, with the light-emitting stack 124 interposed therebetween, and is connected to a low-voltage supply line.

The encapsulation unit 140 prevents external moisture or oxygen from permeating the light-emitting element 120, which is vulnerable to external moisture or oxygen. To this end, the encapsulation unit 140 includes at least one inorganic encapsulation layer 142, 146 and at least one organic encapsulation layer 144. In the present invention, the structure of the encapsulation unit 140, in which the first inorganic encapsulation layer 142, the organic encapsulation layer 144 and the second inorganic encapsulation layer 146 are stacked in that order, will be described by way of example.

The first inorganic encapsulation layer 142 is formed on the substrate 111, on which the cathode 126 has been formed. The second inorganic encapsulation layer 146 is formed on the substrate 111, on which the organic encapsulation layer 144 has been formed, so as to cover the top surface, the bottom surface and the side surface of the organic encapsulation layer 144 together with the first inorganic encapsulation layer 142.

The first and second inorganic encapsulation layers 142 and 146 minimize or prevent the permeation of external moisture or oxygen into the light-emitting stack 124. The first and second inorganic encapsulation layers 142 and 146 are formed of an inorganic insulating material that is capable of being deposited at a low temperature, such as silicon nitride (SiNx), silicon oxide (SiOx), silicon oxynitride (SiON), or aluminum oxide ($Al_2O_3$). Thus, since the first and second inorganic encapsulation layers 142 and 146 are deposited in a low-temperature atmosphere, it is possible to prevent damage to the light-emitting stack 124, which is vulnerable to a high-temperature atmosphere, during the process of depositing the first and second inorganic encapsulation layers 142 and 146.

The organic encapsulation layer 144 serves to dampen the stress between the respective layers due to bending of the organic light-emitting display device and to increase planarization performance. The organic encapsulation layer 144 is formed on the substrate 111, on which the first inorganic encapsulation layer 142 has been formed, using a non-photosensitive organic insulating material, such as PCL, acrylic resin, epoxy resin, polyimide, polyethylene or silicon oxycarbide (SiOC), or using a photosensitive organic insulating material such as photoacryl. The organic encapsulation layer 144 is disposed in the active area, rather than in the non-active area.

The mesh-type touch electrodes 150 and the touch lines 160 are disposed on the encapsulation unit 140. In order to prevent an increase in the capacitance of the parasitic capacitor between the touch electrodes 150 and the cathode 126, a touch buffer film 148, which is implemented as an inorganic or organic insulating film, can be disposed between the encapsulation unit 140 and the touch electrodes 150. In this case, the touch lines 160 are disposed along the side surface of the touch buffer film 148. In a touch display device not including the touch buffer film 148, the touch lines 160 are disposed along the side surface of the second inorganic encapsulation layer 146.

The touch electrodes 150 and the touch lines 160 are disposed in the same plane and are formed of the same material. For example, the touch electrodes 150 and the touch lines 160 are disposed in a single-layered structure without an insulating film. Accordingly, the touch electrodes 150 and the touch lines 160 can be formed through a single mask process. Further, it is possible to reduce the thickness of the touch display device that includes the touch electrodes 150 and the touch lines 160.

The touch electrodes 150 and the touch lines 160 are formed in a single-layered or multi-layered structure using a touch metal layer formed of a material having high corrosion resistance and acid resistance and excellent conductivity, such as Ta, Ti, Cu, or Mo. For example, the touch electrodes 150 and the touch lines 160 are formed in a triple-layered structure such as a stack of Ti/Al/Ti, MoTi/Cu/MoTi, or Ti/Al/Mo.

Black matrixes can be disposed on the touch electrodes 150 and the touch lines 160, and color filters can be disposed between the black matrixes.

The black matrixes prevent the touch electrodes 150 and the touch lines 160 from being visible due to reflection of external light. The color filters prevent the cathode 126 from being visible due to reflection of external light. Further, the black matrixes and the color filters can be disposed between the touch electrodes 150 and the encapsulation unit 140 in order to prevent an increase in the capacitance of the parasitic capacitor between the touch electrodes 150 and the cathode 126.

A touch pad 170 connected to the touch lines 160 is connected to a signal transmission film on which the touch-driving circuit is mounted.

The touch pad 170 includes a lower touch pad electrode 172 and an upper touch pad electrode 174 that is in contact with the lower touch pad electrode 172. The lower touch pad electrode 172 is disposed in the same plane as at least one of the gate electrode 132 and the drain electrode 138, and is formed of the same material. For example, the lower touch pad electrode 172 is formed of the same material as the drain electrode 138, and is disposed in the same plane as the drain electrode 138, i.e., on the interlayer insulating film 114. The upper touch pad electrode 174 is disposed in the same plane as the touch electrode 150, and is formed of the same material. The upper touch pad electrode 174 is electrically connected to the lower touch pad electrode 172, which is exposed through a touch pad contact hole 176 that penetrates the protective film 108 and the touch buffer film 148.

Figure 4:
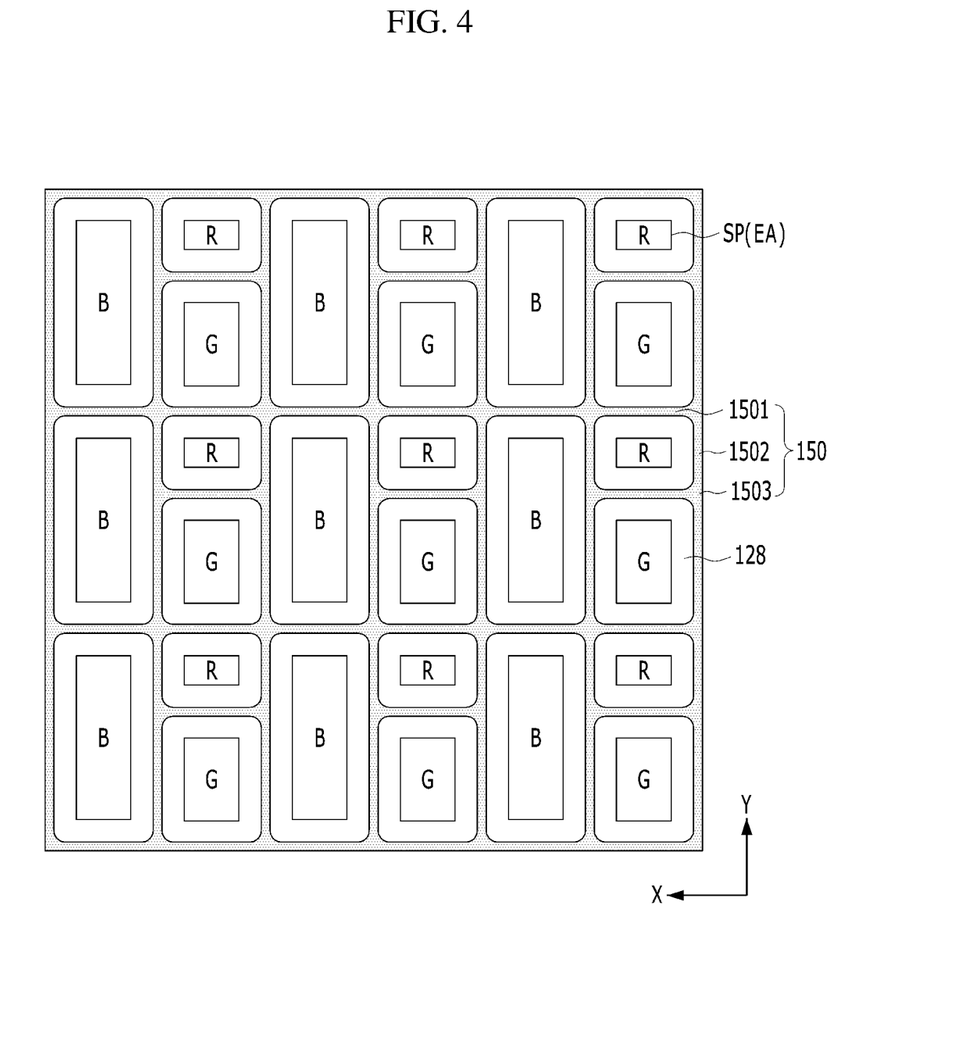
FIG. 4 is a plan view showing an example of the touch electrodes shown in FIG. 1.
Figure 5:
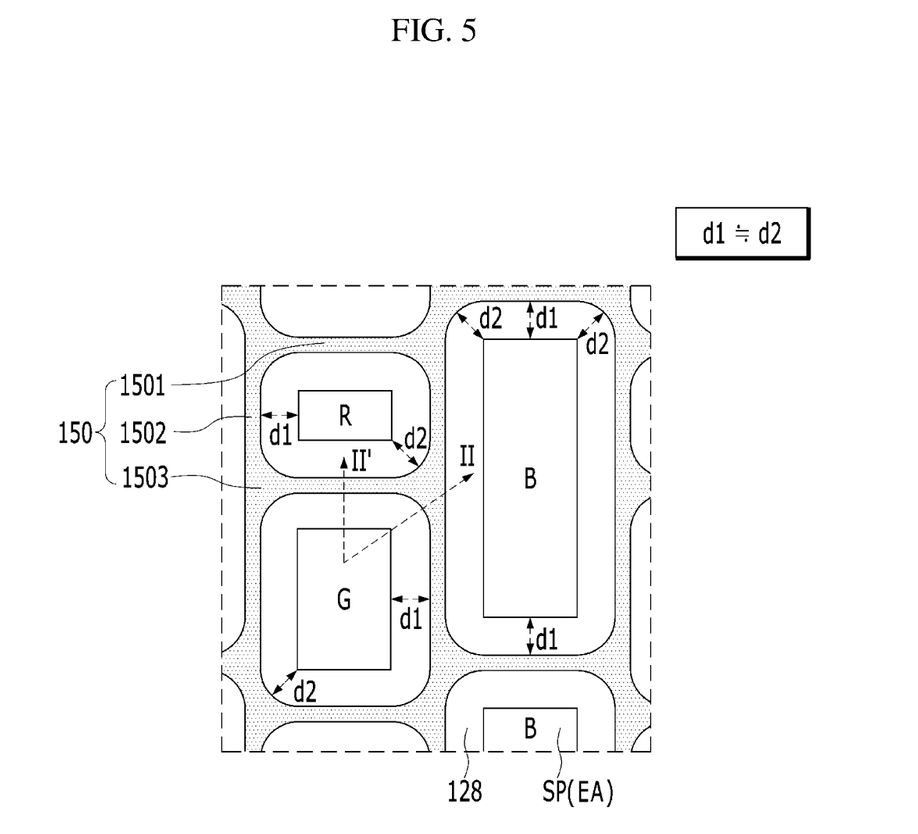
FIG. 5 is a plan view showing a portion of the touch electrodes shown in FIG. 4 in detail.
Figure 6:
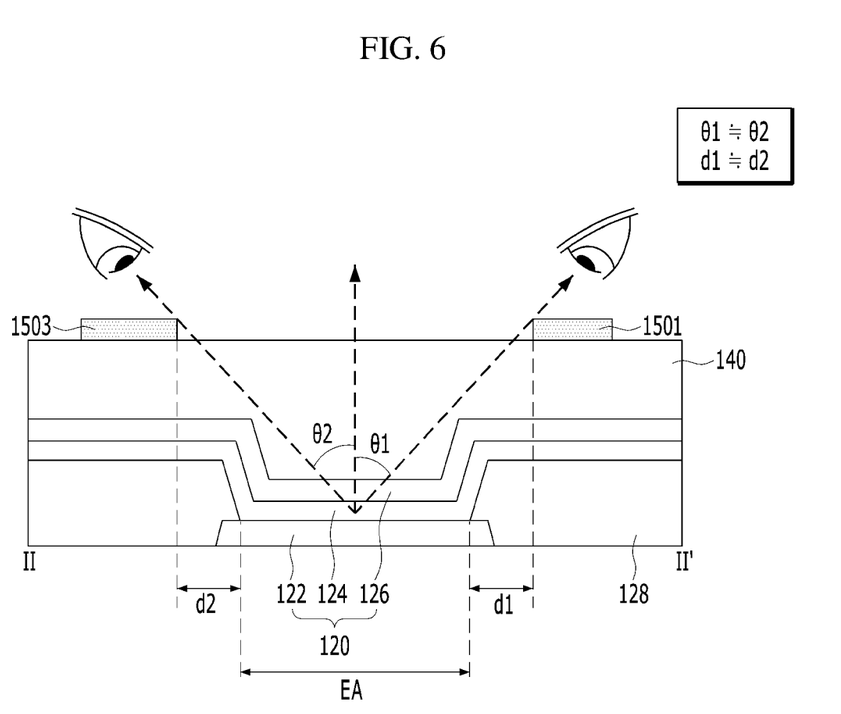
FIG. 6 is a cross-sectional view of the touch display device taken along line II-II' in FIG. 5.

FIG. 4 is a plan view showing an example of the touch electrodes shown in FIG. 1. FIG. 5 is a plan view showing a portion of the touch electrodes shown in FIG. 4 in detail. FIG. 6 is a cross-sectional view of the touch display device taken along line II-II' in FIG. 5.

As shown in FIG. 4, the touch electrodes 150 of the touch display device according to the embodiments of the present invention overlap the bank 128 defining the emission area EA, and have a smaller width than the bank 128. Each touch electrode 150 includes first to third electrode portions 1501, 1502 and 1503. The touch electrodes 150 are formed to surround the emission area EA.

As shown in FIGS. 5 and 6, the first electrode portion 1501 extends in an X direction, and is disposed between the red (R) subpixel SP and the green (G) subpixel SP and between the blue (B) subpixels SP. The first electrode portion 1501 is formed to have a constant line width. The first electrode portion 1501 is spaced a first distance d1 apart from the emission area EA, which is the top surface of the first anode 122, which is exposed by the bank 128. For example, the first electrode portion 1501 is spaced the first distance d1 apart from the side surface of the bank 128, which exposes the emission area EA.

The second electrode portion 1502 extends in a Y direction intersecting the X direction, and is disposed between the red (R) subpixel SP and the blue (B) subpixel SP and between the green (G) subpixel SP and the blue (B) subpixel SP. The second electrode portion 1502 is formed to have a constant line width. The second electrode portion 1502 is spaced the first distance d1 apart from the emission area EA, which is the top surface of the first anode 122, exposed by the bank 128. For example, the second electrode portion 1502 is spaced the first distance d1 apart from the side surface of the bank 128, which exposes the emission area EA.

The third electrode portion 1503 is disposed at the intersection of the first and second electrode portions 1501 and 1502. The minimum line width of the third electrode portion 1503 is the same as the line width of each of the first and second electrode portions 1501 and 1502, and the maximum line width of the third electrode portion 1503 is larger than the line width of each of the first and second electrode portions 1501 and 1502. The third electrode portion 1503 is formed such that the width thereof gradually increases from the second electrode portion (the first electrode portion) to the center portion thereof. Since the entire area of the touch electrode 150 increases due to the third electrode portion 1503, the resistance of the touch electrode 150 can be reduced, whereby touch sensitivity can be improved.

The third electrode portion 1503, which has a larger width than each of the first and second electrode portions 1501 and 1502, is an opposing region that faces a corner region of each emission area EA exposed by the bank 128, and is formed in a different shape from the corner region. For example, the corner region of the emission area EA is formed to have a vertex, and the surface of the third electrode portion 1503 that faces the vertex of the emission area EA is formed in a rounded shape (e.g., concavely rounded shape). The third electrode portion 1503 has two concavely rounded surfaces between one blue (B) subpixel SP and one red (R)/green (G) subpixel SP. Further, the third electrode portion 1503 has four concavely rounded surfaces between two blue (B) subpixels SP and one red (R)/green (G) subpixel SP.

The third electrode portion 1503 is spaced a second distance d2 apart from the emission area EA, which is the top surface of the first anode 122 exposed by the bank 128. For example, the third electrode portion 1503 is spaced the second distance d2 apart from the side surface of the bank 128, which exposes the emission area EA. In this case, the second distance d2 is the same as or similar to the first distance d1.

The spacing distances d1 and d2 between the first to third electrode portions 1501, 1502 and 1503 and the emission area EA exposed by the bank 128 are constant. For example, the spacing distance d1 in the vertical and horizontal directions between each of the first and second electrode portions 1501 and 1502 and the emission area EA is the same as or similar to the spacing distance d2 in the diagonal direction between the third electrode portion 1503 and the emission area EA.

Accordingly, the lateral viewing angle θ1 in the horizontal/vertical direction within which the emission area EA is visible without being blocked by the touch electrode 150 is the same as the lateral viewing angle θ2 in the diagonal direction within which the emission area EA is visible without being blocked by the touch electrode 150. Since the color coordinate characteristics at the lateral viewing angle in the horizontal/vertical direction and the color coordinate characteristics at the lateral viewing angle in the diagonal direction are similar to each other, it is possible to eliminate the difference between viewpoints due to variation in the color coordinate characteristics depending on the viewing direction.

Table 1 shows the characteristics of a touch display device according to a comparative example and the touch display device according to the embodiment of the present invention.

In Table 1, the touch display device according to the comparative example is configured such that a third electrode portion of a touch electrode is formed in a straight shape, and the touch display device according to the embodiment of the present invention is configured such that the third electrode portion 1503 of the touch electrode 150 is formed in a curved shape.

TABLE 1

|  | Comparative Example | Embodiment of the Present Invention |
| --- | --- | --- |
| Color Shift | Occurrence of Viewpoint Difference | No Viewpoint Difference |
| Touch Resistance | High | Low |
| Touch Sensitivity | Low | High |

In the comparative example, the spacing distance in the diagonal direction between the third electrode portion of the touch electrode and the emission area is longer than the spacing distance in the vertical/horizontal direction between each of the first and second electrode portions of the touch electrode and the emission area. Accordingly, viewpoints at which color shift occurs are formed differently between when viewing the screen at the viewing angle in the diagonal direction and when viewing the screen at the lateral viewing angle in the horizontal and vertical directions.

On the other hand, according to the embodiment, the spacing distance d2 in the diagonal direction between the third electrode portion 1503 of the touch electrode and the emission area EA and the spacing distance d1 in the vertical/horizontal direction between each of the first and second electrode portions 1501 and 1502 of the touch electrode and the emission area EA are the same as each other. Accordingly, viewpoints at which color shift occurs are identically formed between when viewing the screen at the viewing angle in the diagonal direction and when viewing the screen at the lateral viewing angle in the horizontal and vertical directions, thereby eliminating the difference between viewpoints at which color shift occurs depending on the viewing direction.

Further, in the comparative example, the touch electrode is formed such that the third electrode portion has the same line width as each of the first and second electrode portions. In contrast, according to the embodiments of the present invention, the touch electrode 150 is formed such that the third electrode portion 1503 has a larger line width than each of the first and second electrode portions 1501 and 1502. Accordingly, the embodiments of the present invention are capable of reducing touch resistance, thus improving touch sensitivity compared with the comparative example.

The embodiments of the present invention have been described by way of example as having a structure in which the third electrode portion 1503 included in the touch electrodes 150 is formed in a rounded shape. However, the touch line 160 in the vertical direction disposed between the touch electrodes 150 shown in FIG. 7A and the touch line 160 in the horizontal direction disposed between the touch electrodes 150 shown in FIG. 7B can include a third line portion having a rounded shape.

Figure 7A:
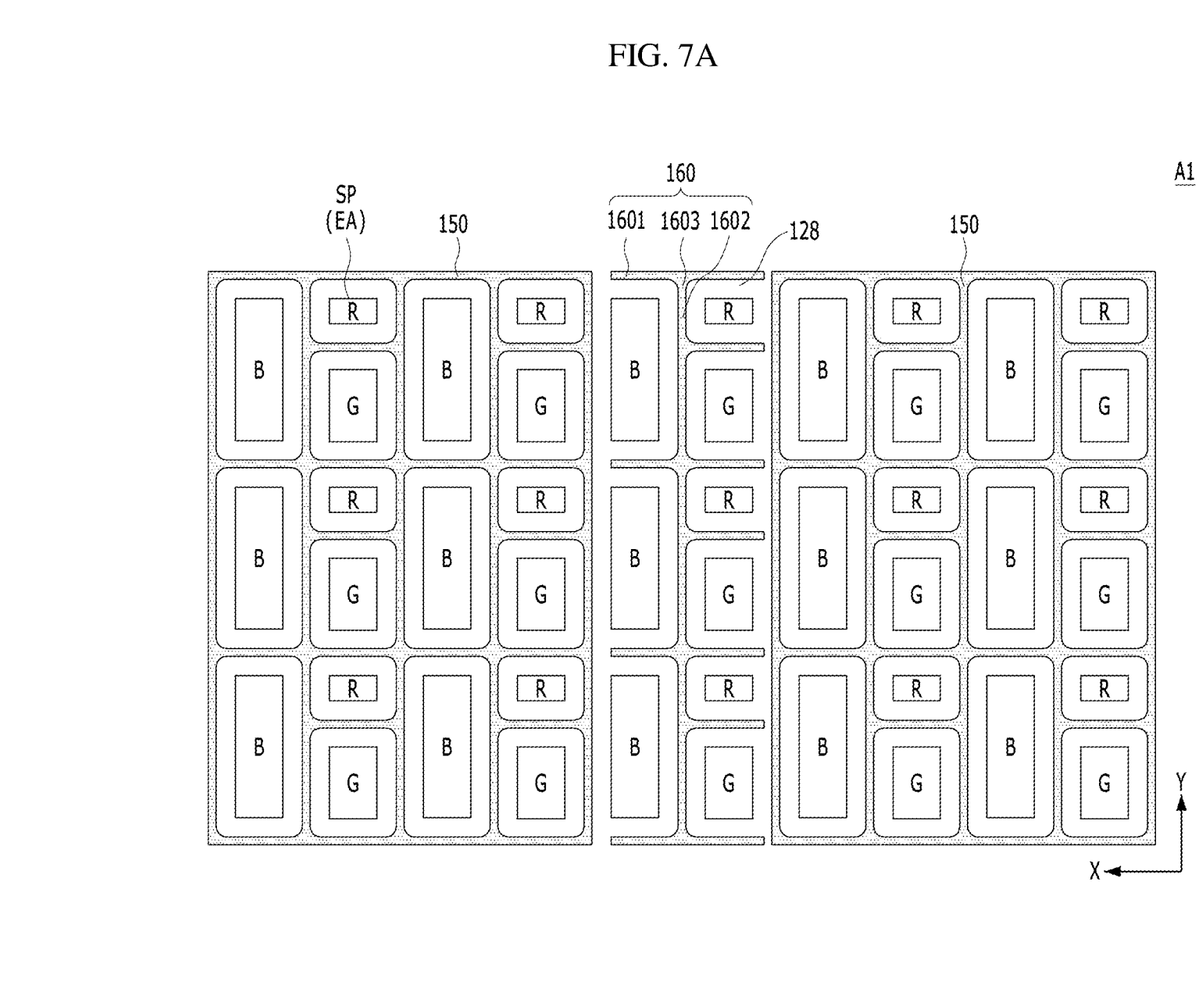
FIG. 7A is a plan view showing the region A1 shown in FIG. 1 in detail.
Figure 7B:
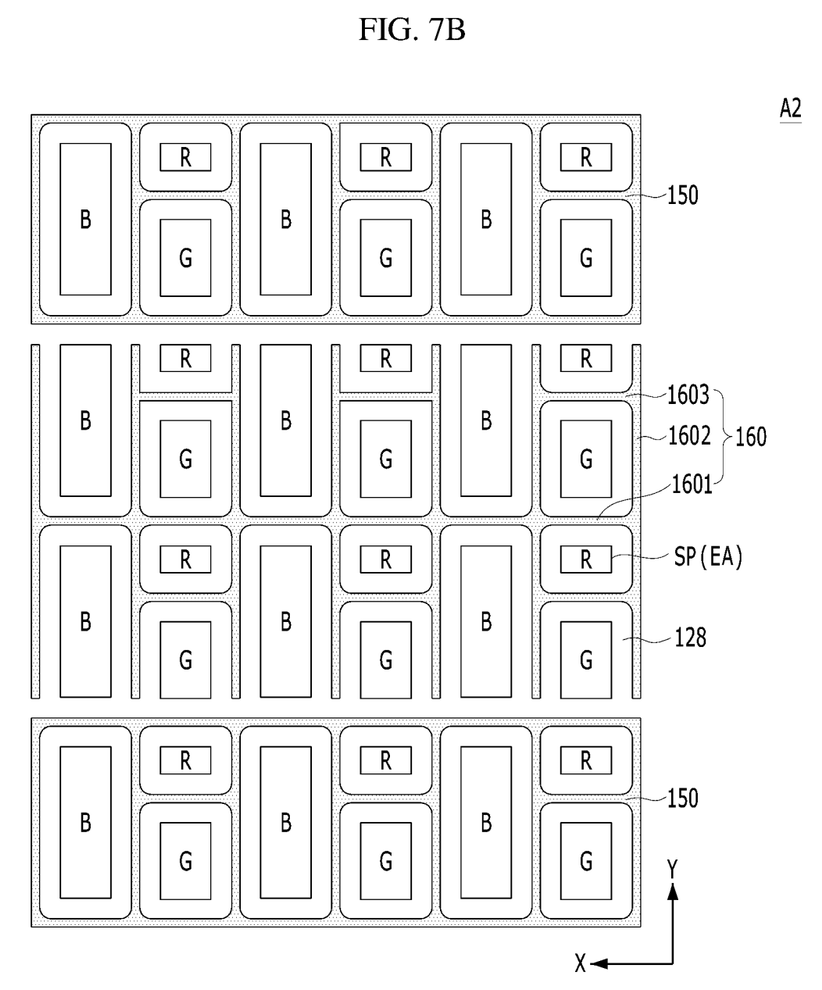
FIG. 7B is a plan view showing the region A2 shown in FIG. 1 in detail.

Specifically, FIG. 7A is a plan view showing the region A1 shown in FIG. 1 in detail, and FIG. 7B is a plan view showing the region A2 shown in FIG. 1 in detail. As shown in FIGS. 7A and 7B, the touch line 160 includes first to third line portions 1601, 1602 and 1603.

The third line portion 1603 is disposed at the intersection of the first line portion 1601, which extends in the X direction, and the second line portion 1602, which extends in the Y direction. The third line portion 1603 is an opposing region that faces each corner region of the emission area EA exposed by the bank 128, and is formed in a different shape from the corner region. For example, the corner region of the emission area EA is formed to have a vertex, and the surface of the third line portion 1603, which faces the vertex of the emission area EA, is formed in a concavely rounded shape. Accordingly, the spacing distances between the first to third line portions 1601, 1602 and 1603 and the emission area exposed by the bank 128 are constant. For example, the spacing distance in the vertical and horizontal directions between each of the first and second line portions 1601 and 1602 and the emission area EA is the same as or similar to the spacing distance in the diagonal direction between the third line portion 1603 and the emission area EA.

Accordingly, the lateral viewing angle in the vertical/horizontal direction within which the emission area is visible without being blocked by the touch line 160 is the same as the lateral viewing angle in the diagonal direction within which the emission area is visible without being blocked by the touch line 160. Since the color coordinate characteristics at the lateral viewing angle in the vertical/horizontal direction and the color coordinate characteristics at the lateral viewing angle in the diagonal direction are similar to each other, it is possible to eliminate the difference between viewpoints due to variation in the color coordinate characteristics depending on the viewing direction.

Figure 8:
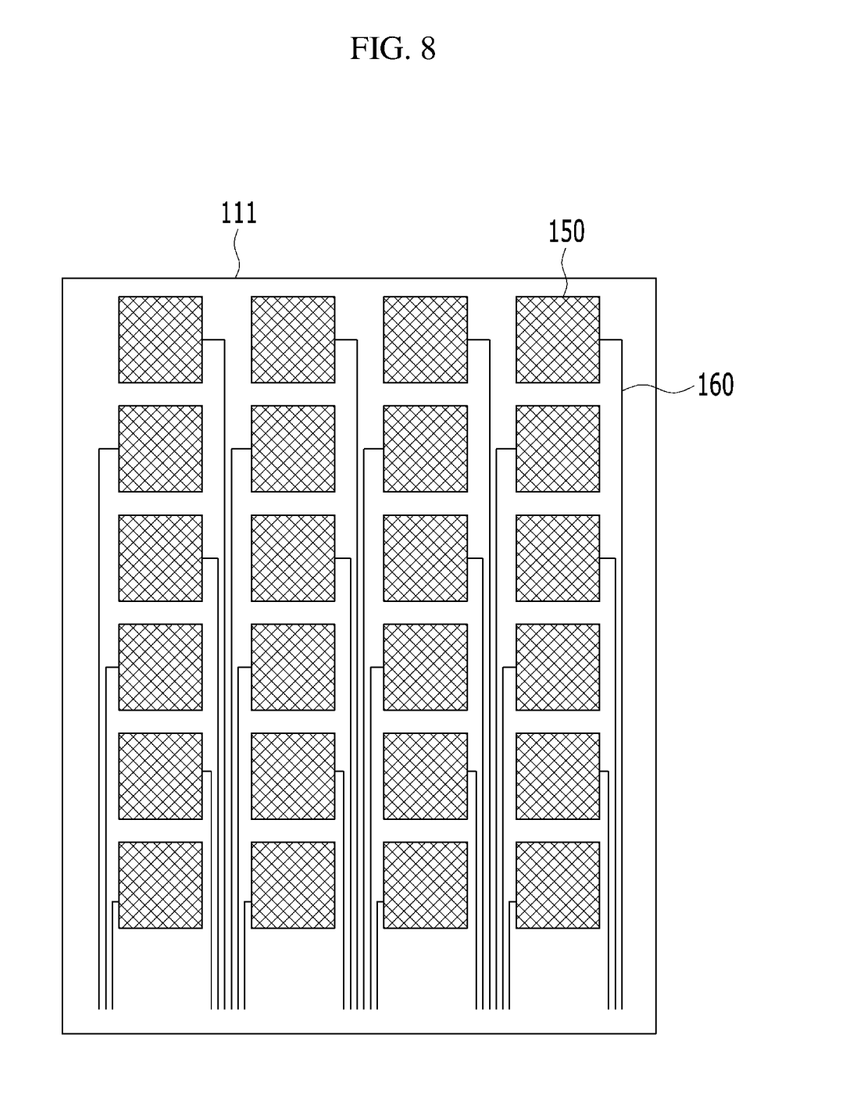
FIG. 8 is a plan view showing another embodiment of the routing lines shown in FIG. 1.

As shown in FIG. 2, the touch lines 160 according to the embodiments of the present invention have been described by way of example as extending to the touch pad 170 through the bezel area. However, as shown in FIG. 8, the touch lines 160 can extend to the touch pad 170 through the non-emission area between the touch electrodes 150.

In addition, although a self-capacitance-type touch sensor structure has been described by way of example, the embodiments of the present invention can also be applied to a mutual-capacitance-type touch sensor structure.

As is apparent from the above description, according to one or more embodiments of the present invention, the spacing distance in the diagonal direction between the touch electrode and the emission area and the spacing distance in the vertical/horizontal direction between the touch electrode and the emission area are the same as each other. Accordingly, when viewing the screen at the lateral viewing angle in the diagonal direction and when viewing the screen at the lateral viewing angle in the horizontal and vertical directions, viewpoints at which color shift occurs are identically formed, thereby eliminating the difference between viewpoints at which color shift occurs depending on the viewing direction.

In addition, according to the embodiments of the present invention, the touch electrode is formed such that a third electrode portion has a larger line width than each of first and second electrode portions, thereby reducing touch resistance by increasing the area of the touch electrode and thus improving touch sensitivity.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A touch display device comprising:
    a plurality of light-emitting elements disposed on a substrate, each light-emitting element including an emission area, and the emission area including a plurality of vertices;
    an encapsulation unit disposed on the plurality of light-emitting elements; and
    a plurality of touch electrodes disposed on the encapsulation unit so as to surround the emission area,
    wherein the plurality of touch electrodes are formed so that surfaces thereof facing the plurality of vertices of the emission area are formed in a rounded shape, and
    wherein a distance from a peripheral edge of the emission area to a corresponding touch electrode is the same in each of the plurality of light-emitting elements.

2. The touch display device according to claim 1, wherein a spacing distance in a horizontal direction and a vertical direction between each of the plurality of touch electrodes and the emission area is the same as a spacing distance in a diagonal direction between each of the plurality of touch electrodes and the emission area.

3. The touch display device according to claim 1, further comprising:
    a bank overlapping the plurality of touch electrodes and exposing an anode of the each light-emitting element to define the emission area.

4. The touch display device according to claim 1, further comprising:
    a plurality of touch lines connected to the plurality of touch electrodes and disposed along a lateral surface of the encapsulation unit.

5. The touch display device according to claim 4, wherein a spacing distance in a horizontal direction and a vertical direction between each of the plurality of touch lines and the emission area is the same as a spacing distance in a diagonal direction between each of the plurality of touch lines and the emission area.

6. The touch display device according to claim 1, wherein the plurality of touch electrodes are constituted in a mesh form that exposes each emission area.

7. The touch display device according to claim 1, wherein the distance from the peripheral edge of the emission area to the corresponding touch electrode is the same for all of a plurality of subpixels or all of the plurality of touch electrodes.

8. A touch display device comprising:
    a light-emitting element disposed in each of a plurality of emission areas;
    an encapsulation unit disposed on the light-emitting element; and
    a plurality of touch electrodes disposed on the encapsulation unit so as to surround the plurality of emission areas, respectively,
    wherein corner regions of each of the plurality of emission areas and opposing regions of each of the plurality of touch electrodes that face the corner regions have different shapes from each other, and
    wherein a distance from a peripheral edge of each emission area to a corresponding touch electrode is the same in each of the plurality of light-emitting elements.

9. The touch display device according to claim 8, wherein each of the corner regions has a vertex, and
    wherein each of the opposing regions is formed in a rounded shape.

10. The touch display device according to claim 8, wherein a spacing distance in a horizontal direction and a vertical direction between each of the plurality of touch electrodes and a corresponding one of the plurality of emission areas is the same as a spacing distance in a diagonal direction between each of the plurality of touch electrodes and a corresponding one of the plurality of emission areas.

11. The touch display device according to claim 8, further comprising:
    a bank overlapping the plurality of touch electrodes and exposing an anode of the light-emitting element to define the plurality of emission areas.

12. The touch display device according to claim 8, further comprising:
    a plurality of touch lines connected to the plurality of touch electrodes and disposed along a lateral surface of the encapsulation unit.

13. The touch display device according to claim 12, wherein a spacing distance in a horizontal direction and a vertical direction between each of the plurality of touch lines and the emission area is the same as a spacing distance in a diagonal direction between each of the plurality of touch lines and the emission area.

14. The touch display device according to claim 8, wherein the plurality of touch electrodes are constituted in a mesh form that exposes each emission area.

15. The touch display device according to claim 8, wherein the distance from the peripheral edge of the emission area to the corresponding touch electrode is the same for all of a plurality of subpixels or all of the plurality of touch electrodes.

16. A touch display device comprising:
a plurality light-emitting elements disposed in a plurality of subpixels comprising a plurality of emission areas, respectively, the plurality of emission areas having different sizes from each other;
an encapsulation unit disposed on the plurality of light-emitting elements; and
a plurality of touch electrodes disposed on the encapsulation unit,
wherein spacing distances from the plurality of emission areas to the plurality of touch electrodes, respectively, are the same in each of the plurality of light-emitting elements.

17. The touch display device according to claim 16, wherein a spacing distance in a horizontal direction and a vertical direction between each of the plurality of touch electrodes and a corresponding one of the emission areas is the same as a spacing distance in a diagonal direction between each of the plurality of touch electrodes and a corresponding one of the emission areas.

18. The touch display device according to claim 16, wherein the emission areas have a plurality of vertices, and
wherein surfaces of the plurality of touch electrodes that face the vertices of the emission areas are formed in a rounded shape.

19. The touch display device according to claim 16, further comprising:
a bank overlapping the plurality of touch electrodes and exposing an anode of the plurality of light-emitting elements to define the plurality of emission areas.

20. The touch display device according to claim 16, further comprising:
a plurality of touch lines connected to the plurality of touch electrodes and disposed along a side surface of the encapsulation unit.

21. The touch display device according to claim 20, wherein a spacing distance in a horizontal direction and a vertical direction between each of the plurality of touch lines and the emission area is the same as a spacing distance in a diagonal direction between each of the plurality of touch lines and the emission area.

22. The touch display device according to claim 16, wherein the plurality of touch electrodes are constituted in a mesh form that exposes each emission area.

23. The touch display device according to claim 16, wherein the distance from the peripheral edge of the emission area to the corresponding touch electrode is the same for all of the plurality of subpixels or all of the plurality of touch electrodes.

* * * * *